United States Patent
Dyer et al.

(10) Patent No.: US 8,362,531 B2
(45) Date of Patent: Jan. 29, 2013

(54) METHOD OF PATTERNING SEMICONDUCTOR STRUCTURE AND STRUCTURE THEREOF

(75) Inventors: Thomas W. Dyer, Pleasant Valley, NY (US); James J. Toomey, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/102,007

(22) Filed: May 5, 2011

(65) Prior Publication Data

US 2011/0215437 A1 Sep. 8, 2011

Related U.S. Application Data

(62) Division of application No. 11/950,741, filed on Dec. 5, 2007, now Pat. No. 7,989,357.

(51) Int. Cl.
*H01L 29/80* (2006.01)
(52) U.S. Cl. .................. 257/288; 257/510; 257/521
(58) Field of Classification Search .................. 257/521, 257/510
See application file for complete search history.

(56) References Cited

U.S. PATENT DOCUMENTS

| | | | |
|---|---|---|---|
| 3,765,969 A | 10/1973 | Kragness et al. | |
| 4,148,133 A | 4/1979 | Kochel et al. | |
| 5,804,314 A | 9/1998 | Field et al. | |
| 6,504,210 B1 * | 1/2003 | Divakaruni et al. | 257/344 |
| 6,545,796 B1 | 4/2003 | Greywall | |
| 6,933,240 B2 | 8/2005 | Lazar et al. | |
| 2006/0003268 A1 | 1/2006 | Hong et al. | |

OTHER PUBLICATIONS

Gebremariam, Office Action Communication for U.S. Appl. No. 11/950,741 dated Sep. 27, 2010, 9 pages.
Gebremariam, Notice of Allowance and Fee(s) Due for U.S. Appl. No. 11/950,741 dated Mar. 23, 2011, 7 pages.

* cited by examiner

*Primary Examiner* — Samuel Gebremariam
(74) *Attorney, Agent, or Firm* — Yuanmin Cai; Hoffman Warnick LLC

(57) ABSTRACT

Method of patterning a semiconductor structure is disclosed. The method involves crystallographic etching techniques to enhance a patterned monocrystalline layer as a hard mask. In one embodiment, the method includes bonding a monocrystalline silicon layer to a non-crystalline protective layer; patterning the monocrystalline layer to form a hard mask; enhancing the pattern of the hard mask; stripping the hard mask after conventional etching of protective layer; and forming a gate oxide thereon. The enhanced patterning of the hard mask is performed with crystallographic etching to replace optical effects of rounding and dimension narrowing at the ends of a defined region with straight edges and sharp corners. A resulting structure from the use of the enhanced patterned hard mask includes a layer of composite materials on the substrate of the semiconductor structure. The layer of composite materials includes different materials in discrete blocks defined by straight edges within the layer.

20 Claims, 8 Drawing Sheets

METHOD OF PATTERNING SEMICONDUCTOR STRUCTURE AND STRUCTURE THEREOF

CROSS-REFERENCE TO RELATED APPLICATIONS

This application is a Divisional of U.S. patent application Ser. No. 11/950,741, filed Dec. 5, 2007 and allowed on Mar. 23, 2011.

BACKGROUND

1. Technical Field

The disclosure relates generally to patterning of semiconductor structure in complementary metal oxide semiconductor (CMOS) circuits fabrication, and more particularly, to method of enhancing a patterned hard mask.

2. Background Art

In the current state of the art, continued complimentary metal oxide semiconductor (CMOS) scaling has resulted in high density CMOS circuitry. Optical effects in the printing of patterns onto substrates of semiconductors for CMOS circuitry fabrication lead to rounding and dimensional reduction at the ends of printed lines. Often, the rounding and dimensional reduction exacerbates the effectiveness of device and circuit operations in a densely packed circuitry. This is demonstrated in 45 nm static random access memory (SRAM) designs at the active area (RX) and polycrystalline layers.

Crystallographic etching has been recognized as a means for enhancing printed patterns at the RX level. The use of this type of etching technique requires a monocrystalline layer. However, as most semiconductor structures involve non-crystalline and polycrystalline layers, the use of crystallographic etching for such enhancement purposes cannot be applied directly to every level of semiconductor fabrication.

SUMMARY

Method of patterning a semiconductor structure is disclosed. The method involves crystallographic etching techniques to enhance a patterned monocrystalline layer as a hard mask. In one embodiment, the method includes bonding a monocrystalline silicon layer to a non-crystalline protective layer; patterning the monocrystalline layer to form a hard mask; enhancing the pattern of the hard mask; stripping the hard mask after conventional etching of protective layer; and forming a gate oxide thereon. The enhanced patterning of the hard mask is performed with crystallographic etching to replace optical effects of rounding and dimension narrowing at the ends of a defined region with straight edges and sharp corners. A resulting structure from the use of the enhanced patterned hard mask includes a layer of composite materials on the substrate of the semiconductor structure. The layer of composite materials includes different materials in discrete blocks defined by straight edges within the layer.

A first aspect of the disclosure provides a method for patterning a semiconductor structure comprising: bonding a monocrystalline layer to a protective layer disposed on the semiconductor structure; lithographically patterning the monocrystalline layer to form a hard mask; applying crystallographic etching to enhance the patterned hard mask; and etching the protective layer according to the enhanced patterned hard mask.

A second aspect of the disclosure provides a semiconductor structure comprising: at least one composite layer formed on a substrate, the composite layer including discrete blocks of different materials, wherein the discrete blocks are defined by straight edges.

A third aspect of the disclosure provides a semiconductor structure comprising: a substrate; and multiple composite layers, wherein at least one of the multiple composite layers is disposed on the substrate, wherein each of the multiple composite layers includes a plurality of discrete blocks of different material, wherein each discrete block is defined by straight edges.

These and other features of the present disclosure are designed to solve the problems herein described and/or other problems not discussed.

BRIEF DESCRIPTION OF THE DRAWINGS

Various aspects of the disclosure will be more readily understood from the following detailed description taken in conjunction with the accompanying drawings that depict different embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1A:
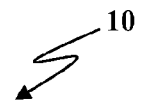
FIGS. 1A, 2A, 3A, 4A, 5A and 6A are top views of various embodiments of a semiconductor structure according to a method of the disclosure.
Figure 1A:
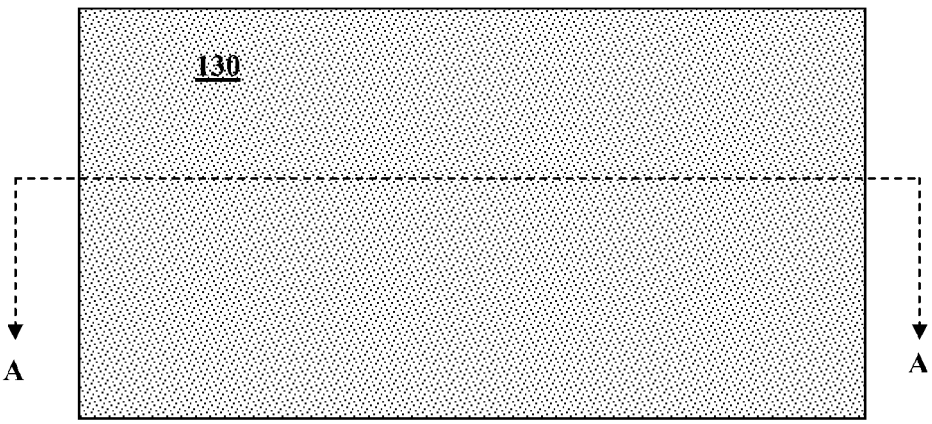

Embodiments depicted in the drawings in FIGS. 1A-8 illustrate the method and various resulting structures of the different aspects of fabricating a patterned semiconductor structure 10.

Figure 1B:
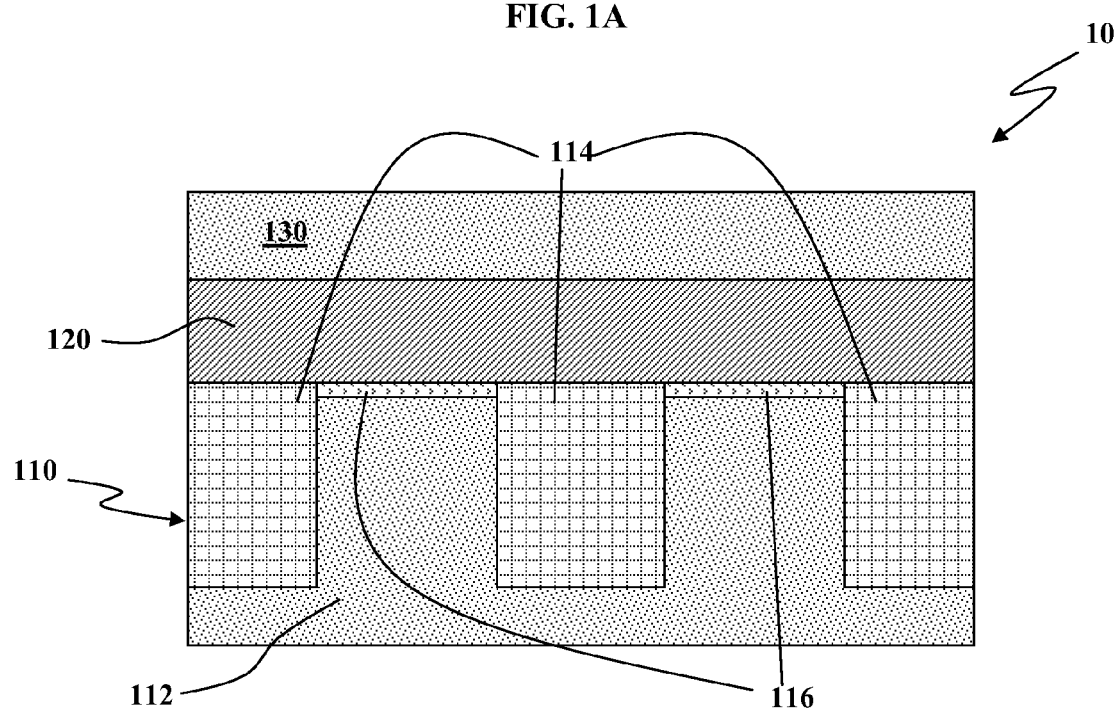
FIGS. 1B, 2B, 3B, 4B, 5B and 6B are cross-sectional views of the various embodiments of the semiconductor structure, taken along the line A-A, in corresponding FIGS. 1A, 2A, 3A, 4A, 5A and 6A, respectively.

FIG. 1A is a top view of a semiconductor structure 10 illustrating a monocrystalline layer 130 disposed thereon. Monocrystalline layer 130 may include, for example, but not limited to: crystalline silicon (Si) of a single orientation (i.e., monocrystalline silicon). Monocrystalline layer 130 may have a thickness ranging from approximately 10 nm to approximately 1000 nm, and preferably within a range of approximately few hundred nanometers. In FIG. 1B, monocrystalline layer 130 is bonded to a protective layer 120 using currently known or later developed processes. Protective layer 120 may be formed from a non-crystalline or polycrystalline insulating material that may be suitably integrated into a fabrication scheme. Protective layer 120 may include, for example, but is not limited to: silicon nitride, doped oxide, silicon-germanium, borosilicate glass (BSG), borophosphosilicate glass (BPSG), and any combination thereof. Protective layer 120 is disposed on substrate 110 using currently known or later developed techniques. Substrate 110 is formed, by currently known or later developed techniques, from a dielectric material 112 with shallow trench isolation regions (STI) 114 and pad oxide regions 116 incorporated therein. Substrate 110 may incorporate critical threshold voltage (Vt) implants (not shown).

Figure 2A:
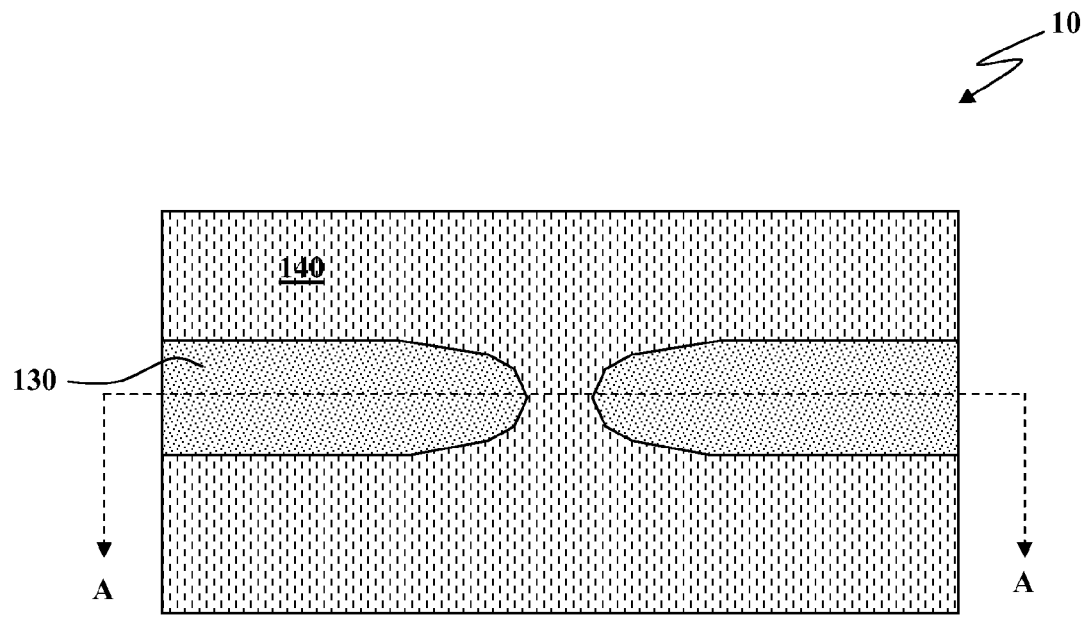
Figure 2B:
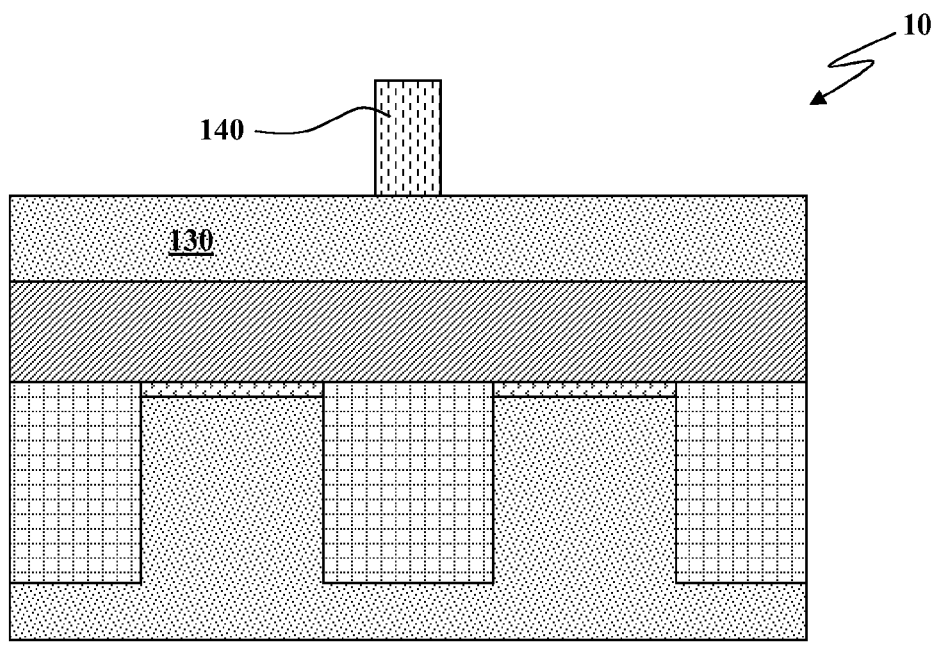

FIG. 2A illustrates a top view of semiconductor structure 10 where a lithographic mask 140 is formed over bonded monocrystalline layer 130. FIG. 2B is a cross-sectional view of semiconductor structure 10 taken along line A-A in FIG. 2A, showing lithographic mask 140 on bonded monocrystalline layer 130. Lithographic etching, for example, but not limited to, reactive ion etching (RIE), transforms bonded monocrystalline layer 130 into hard mask 132 (FIG. 3A) having the same pattern as lithographic mask 140, which is removed concurrently.

Figure 3A:
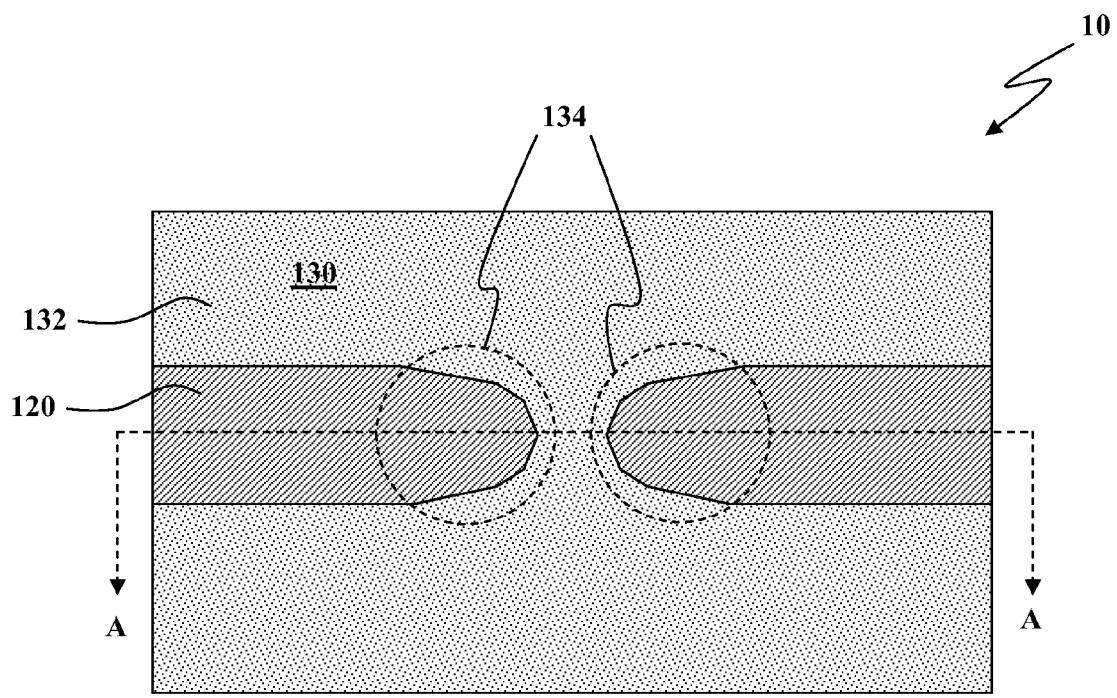
Figure 3B:
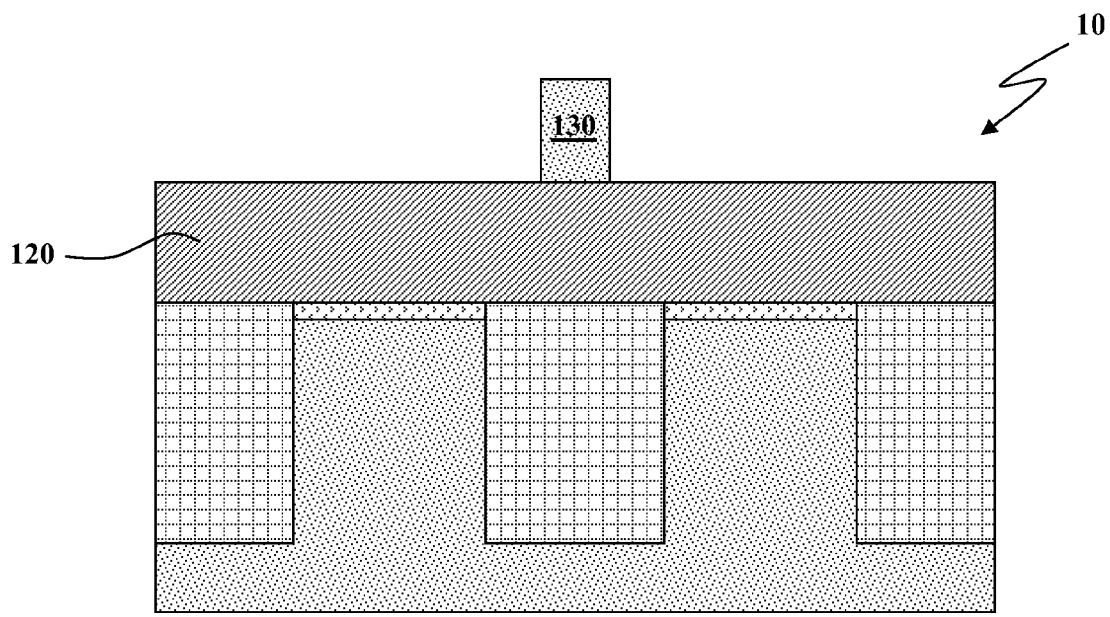
Figure 4A:
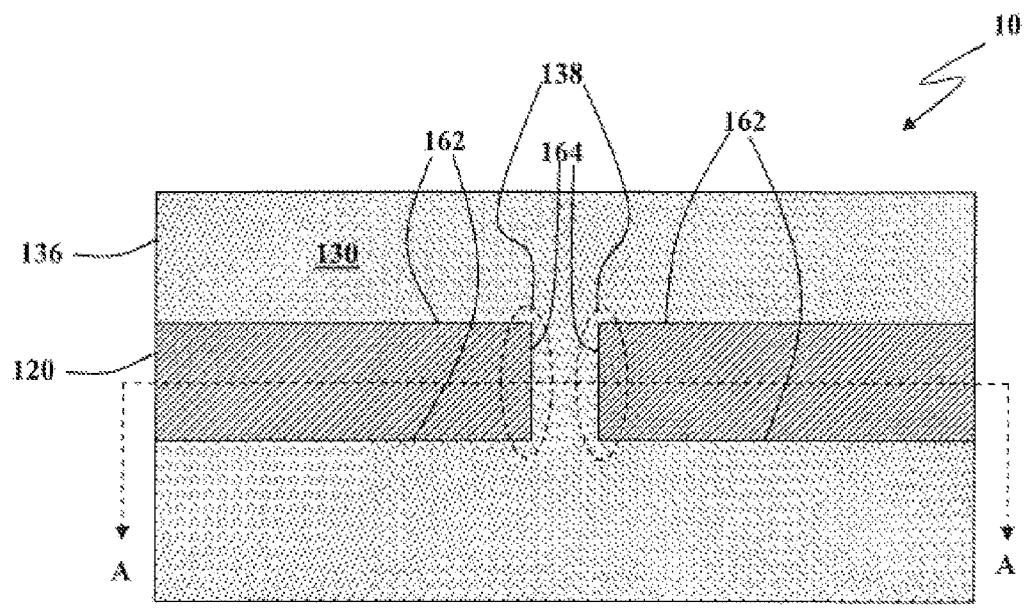

The top view illustrated in FIG. 3A shows patterned hard mask 132 of single or mono crystalline orientation over protective layer 120. FIG. 3B is an alternative view showing the cross-section of semiconductor structure 10 taken along line A-A in FIG. 3A. The pattern on hard mask 132 is enhanced by currently known or later developed crystallographic etching techniques, for example, but not limited to wet etching with ammonium hydroxide in a protic solvent, to form enhanced patterned hard mask 136 (FIG. 4A). The single crystalline orientation of monocrystalline silicon layer 130 provides for crystallographic etching to remove any rounding and dimensional narrowing of curved surfaces 134.

As shown in FIG. 4A, enhanced patterned hard mask 136 includes straight edges 162, 164 that meet at sharp corners 138. Straight edges 162 that are parallel keeps a substantially constant spacing; while straight edges 162 and 164 that meet are substantially perpendicular to each other. In an alternative view illustrated in FIG. 4B, monocrystalline layer 130, which is bonded to protective layer 120 is converted into enhanced patterned hard mask 136 following crystallographic etching.

Figure 4B:
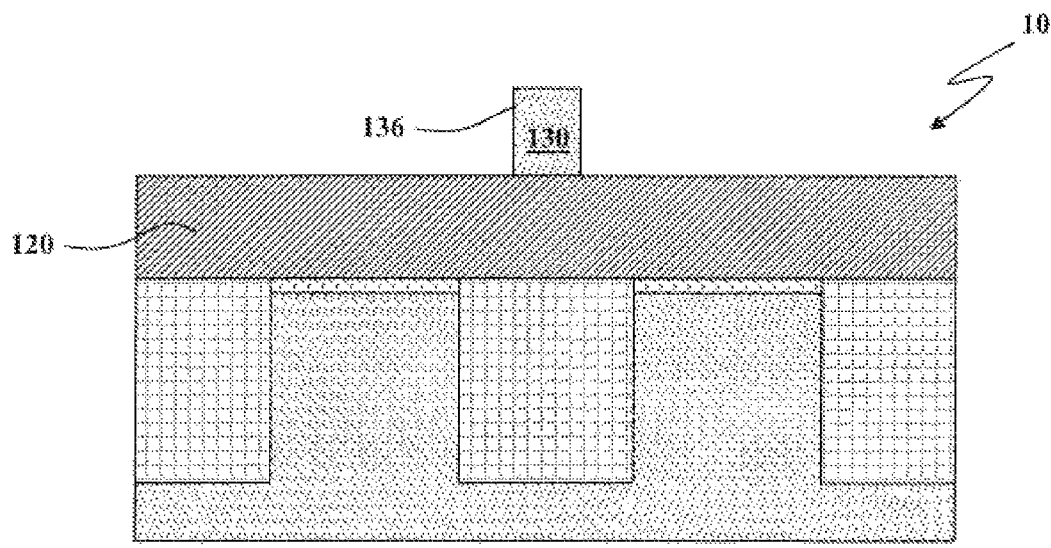
Figure 5A:
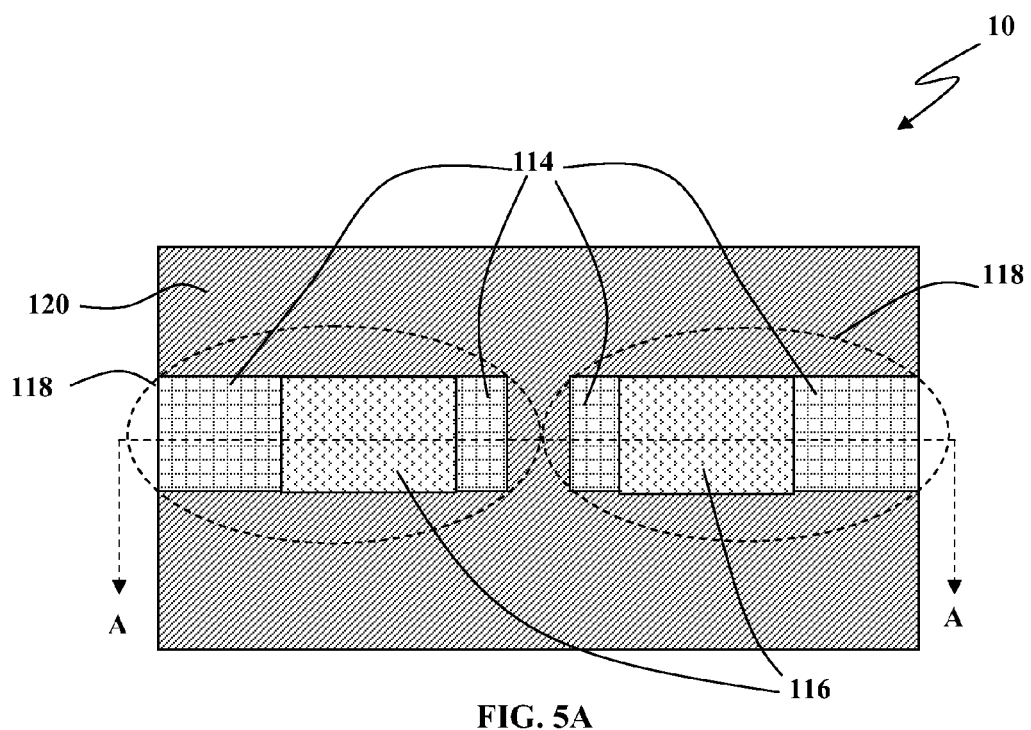
Figure 5B:
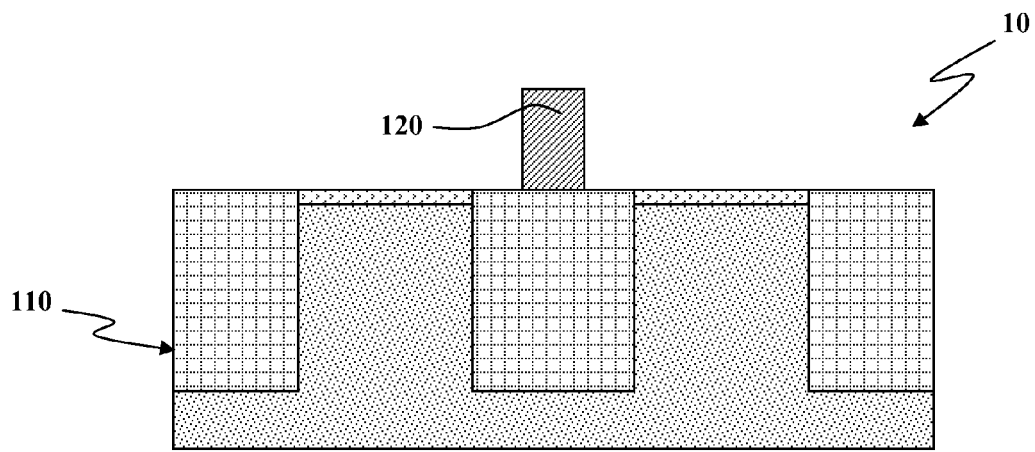

FIG. 5A illustrates a top view of an embodiment of semiconductor structure 10 after further processing of protective layer 120. Protective layer 120 is etched by currently known or later developed etching techniques, for example, but not limited to, RIE, according to enhanced patterned hard mask 136 (FIG. 4A-4B). Patterned protective layer 120 exposes regions 118 of substrate 110, which includes portions of STI 114 and pad oxide regions 116.

Figure 6A:
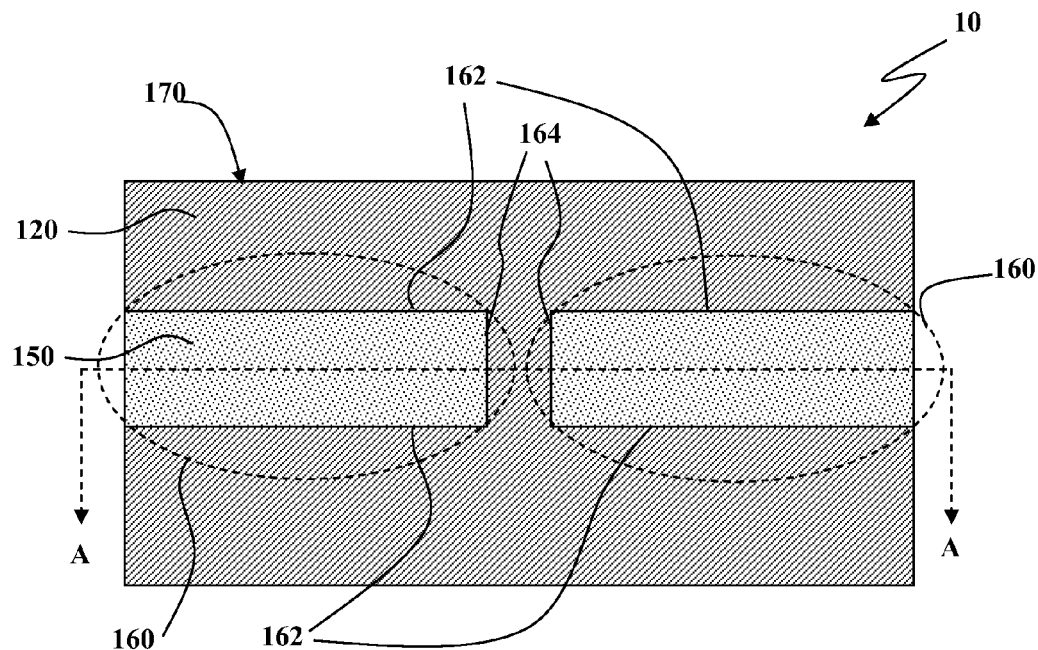

In FIG. 6A, regions 118 (FIG. 5A) are covered by an oxide layer 150 deposited on substrate 110. Oxide layer 150 may include any material suitable for use as a gate conductor, for example, but is not limited to, silicon dioxide ($SiO_2$), silicoxynitride, hafnium dioxide ($HfO_2$), aluminum oxide ($Al_2O_3$) and zirconium dioxide ($ZrO_2$). Oxide layer 150 is formed by currently known or later developed techniques, including for example, but not limited to deposition and chemical mechanical polishing (CMP). Oxide layer 150 may have a thickness ranging from approximately 1 nm to approximately 10 nm.

Figure 6B:
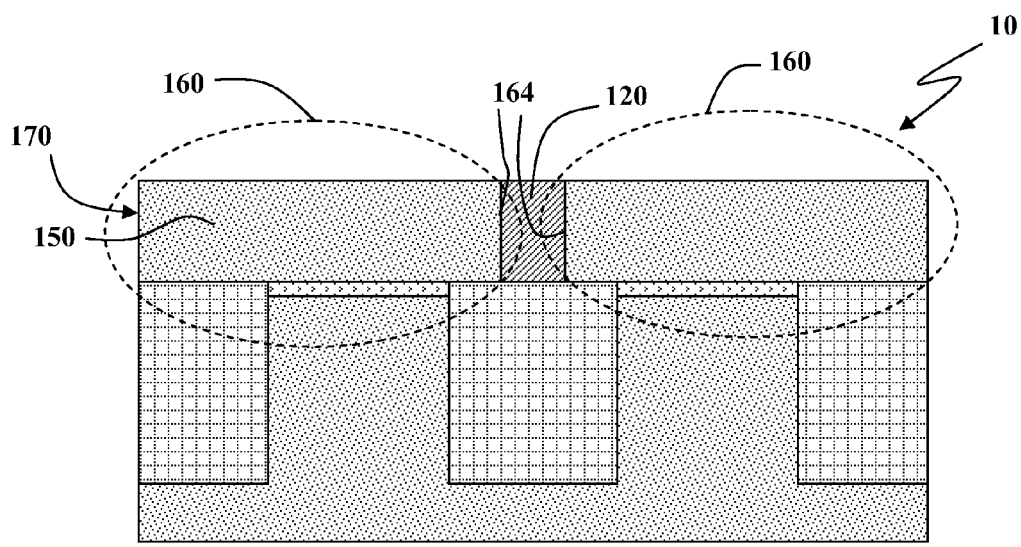

As shown in FIGS. 6A and 6B, oxide layer 150 is incorporated as part of the protective layer 120 covering exposed region 118 of substrate 110 to form a composite layer 170 of different materials on substrate 110. Composite layer 170 includes different materials in discrete blocks 160, defined by straight edges 162, 164 therein.

Figure 7A:
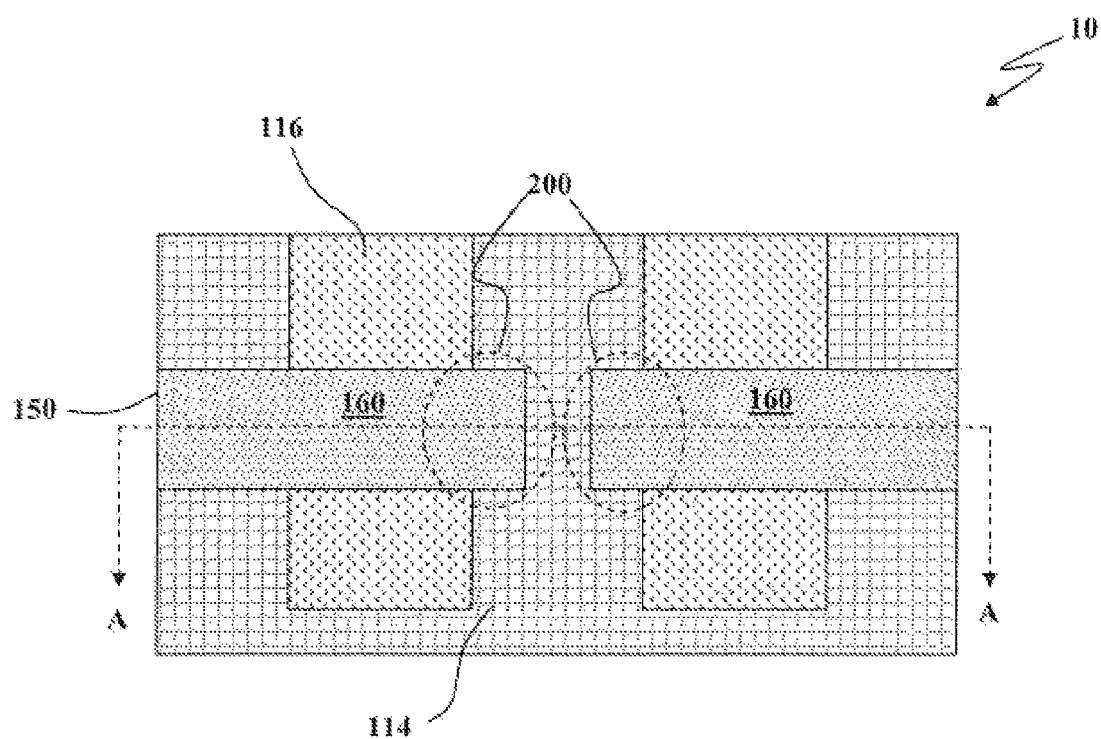
FIG. 7A is a top view of an embodiment of a semiconductor structure resulting from the method of FIGS. 1A-6B.
Figure 7B:
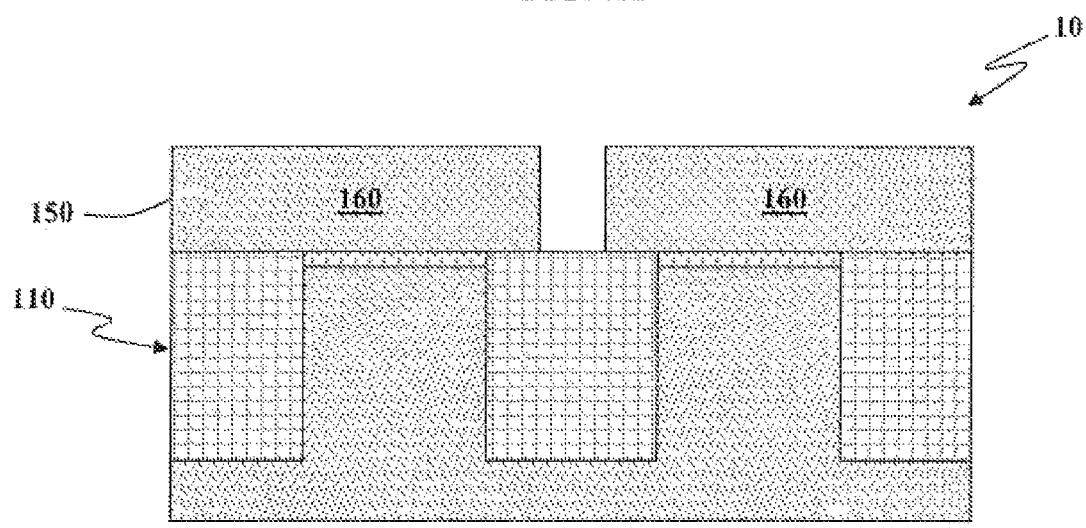
FIG. 7B is a cross-sectional view of the embodiment of the semiconductor structure taken along the line A-A in corresponding FIG. 7A.

FIGS. 7A and 7B illustrate an embodiment of a resulting semiconductor structure 10 with further processing from the structure from FIG. 6B. When remaining protective layer 120 (FIG. 6A and FIG. 6B) is stripped using currently known or later developed processes, oxide layer 150 that remains (FIG. 7A) presents a better defined gate conductor in discrete block 160, defined by straight edges 200, as compared to a gate conductor created without enhanced patterned hard mask 136 (FIG. 4A-4B).

Figure 8:
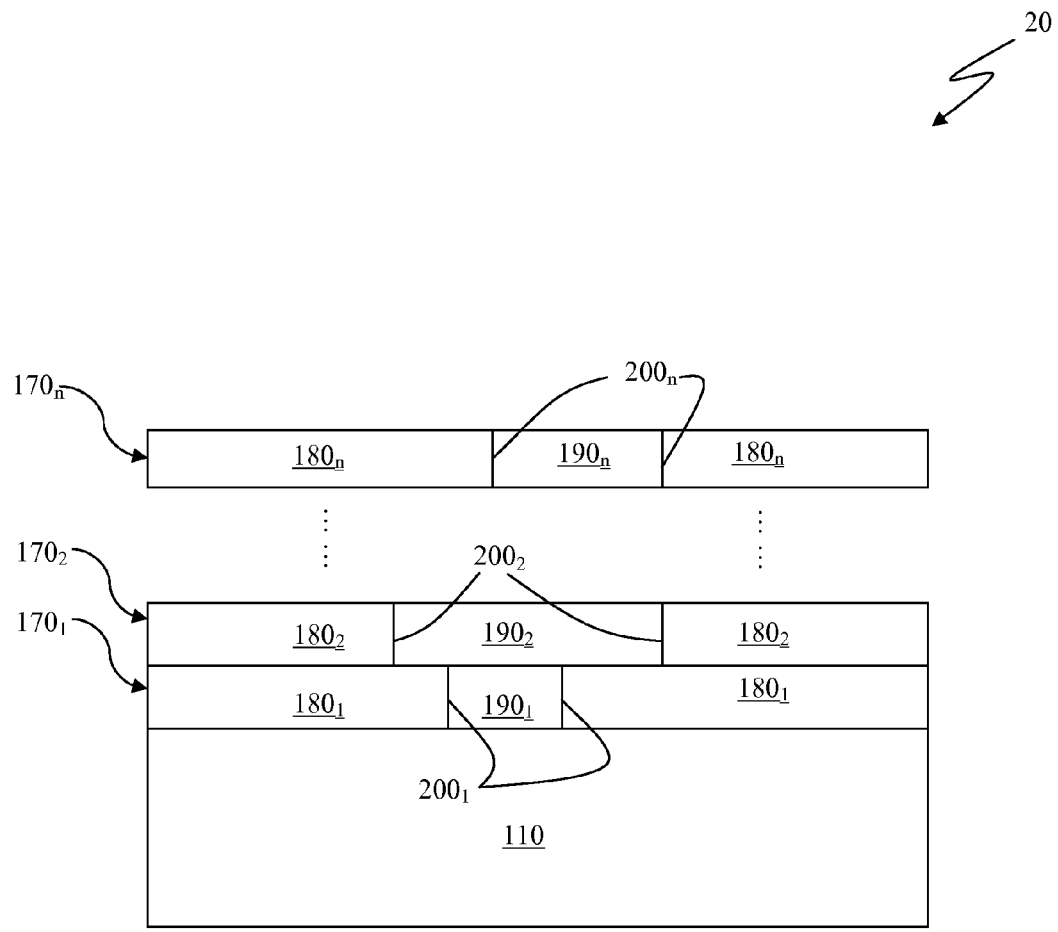
FIG. 8 is a cross-sectional view of an embodiment of a semiconductor structure illustrating multiple composite layers formed by the method of the disclosure.

The method according to the disclosure may be repeated to form a semiconductor structure 20 (FIG. 8) with multiple composite layers $170_i$, where i=1, 2, 3, . . . n and n is an integer. FIG. 8 illustrates semiconductor structure 20 with multiple composite layers $170_i$ built on a substrate 110. Substrate 110 may include features (not shown) including, for example, but not limited to, deep trench isolations (not shown), STI (not shown), pad oxide regions (not shown), high aspect ratio via/contacts (not shown). Composite layers $170_1$, $170_2$, . . . $170_n$ may be interspersed with non-composite layers, for example, a single monocrystalline layer, an oxide layer, a nitride layer, a polysilicon layer or a metal layer. Each of the composite layers $170_1$, $170_2$, . . . $170_n$ includes one or more discrete blocks $180_j$, $190_k$ of different materials therein, where j and k=1, 2, 3, . . . n, and n is an integer. The thickness of each composite layer $170_i$ may vary according to a desired requirement in the fabrication process. Each discrete region $180_j$ within a composite layer $170_i$ interfaces an adjacent discrete region $190_k$ at straight edges 200 that define that region. Straight edges 200 meet at specific angles according to the crystalline characteristic of a material used in the enhanced patterning process of the disclosed method. For example, the specific angle may be selective to a monocrystalline material where crystallographic etching would result in, for example, an angle of 45°, 60° or 90° in the enhanced patterned hard mask. In the case where the specific angle is 90°, the edges are perpendicular and do not taper towards each other.

The foregoing description of various aspects of the disclosure has been presented for purposes of illustration and description. It is not intended to be exhaustive or to limit the scope of the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A semiconductor structure comprising:
   a substrate;
   at least one pad oxide region disposed in a portion of the substrate; and
   at least one composite layer formed on the substrate, the composite layer including discrete blocks of different materials, the discrete blocks defined by straight edges,
   wherein the discrete blocks are on the same plane and include at least one gate conductor block, and
   wherein the at least one gate conductor block is disposed proximate the at least one pad oxide region on the substrate.

2. The semiconductor structure of claim 1, wherein each of the straight edges meets an adjacent straight edge to form a substantive right-angle.

3. The semiconductor structure of claim 1, wherein each of the discrete blocks has a discrete block thickness substantially equivalent to a composite thickness of the composite layer.

4. The semiconductor structure of claim 1, wherein each of the straight edges meets at an adjacent straight edge to form an angle selected from one of a 45° angle, a 60° angle, and a 90° angle.

5. The semiconductor structure of claim 1, wherein an angle of the straight edges is determined by a crystalline characteristic of a material used to etch the discrete blocks.

6. The semiconductor structure of claim 1, wherein each of the straight edges are substantially parallel to an adjacent straight edge.

7. The semiconductor structure of claim 6, wherein each of the straight edges and an adjacent straight edge are separated at a substantially constant spacing.

8. The semiconductor structure of claim 1, wherein the different materials includes one selected from a group consisting of: a non-crystalline material, a monocrystalline material, a polycrystalline material and a combination thereof.

9. The semiconductor structure of claim 8, wherein the different materials include a gate oxide material.

10. The semiconductor structure of claim 9, wherein the gate oxide material is disposed directly above at least one shallow trench isolation (STI) region formed in the substrate and the at least one pad oxide region incorporated in the substrate.

11. The semiconductor structure of claim 8, wherein the different materials include one selected from a group consisting of: silicon nitride, doped oxide, silicon-germanium, borosilicate glass (BSG), borophosphosilicate glass (BPSG), and a combination thereof.

12. A semiconductor structure comprising:
a substrate; and
at least one pad oxide region disposed in a portion of the substrate;
multiple composite layers disposed above the substrate,
wherein at least one of the multiple composite layers is disposed on the substrate,
wherein each of the multiple composite layers includes a plurality of discrete blocks of different material defined by straight edges, the plurality of discrete blocks in each composite layer disposed on the same plane and including at least one gate conductor block, and
wherein the at least one gate conductor block is disposed proximate the at least one pad oxide region on the substrate.

13. The semiconductor structure of claim 12, wherein the straight edges are substantially parallel.

14. The semiconductor structure of claim 12, wherein each of the discrete blocks has a discrete block thickness substantially equivalent to a composite thickness of the composite layer.

15. The semiconductor structure of claim 12, wherein the different materials include one selected from a group consisting of: silicon nitride, doped oxide, silicon-germanium, borosilicate glass (BSG), borophosphosilicate glass (BPSG), silicon dioxide ($SiO_2$), silicoxynitride, hafnium dioxide ($HfO_2$), aluminum oxide ($Al_2O_3$), zirconium oxide ($ZrO_2$), and a combination thereof.

16. The semiconductor structure of claim 12, wherein the straight edges form an angle selective to a monocrystalline material used in crystallographic etching.

17. The semiconductor structure of claim 16, wherein the angle includes one of a 45° angle, a 60° angle, and a 90° angle.

18. A semiconductor structure comprising:
a substrate; and
multiple composite layers disposed above the substrate,
wherein at least one of the multiple composite layers includes a gate conductor block disposed on the substrate proximate at least one pad oxide region in the substrate,
wherein each of the multiple composite layers includes a plurality of discrete blocks of different material, the plurality of discrete blocks in each composite layer disposed on the same plane, and
wherein each discrete block is defined by substantially parallel straight edges that form an angle selective to a monocrystalline material used in crystallographic etching.

19. The semiconductor structure of claim 18, wherein the angle includes one of a 45° angle, a 60° angle, and a 90° angle.

20. The semiconductor structure of claim 18, wherein each of the discrete blocks has a discrete block thickness substantially equivalent to a composite thickness of the composite layer.

\* \* \* \* \*